United States Patent
Braren et al.

[11] Patent Number: 5,260,108
[45] Date of Patent: Nov. 9, 1993

[54] SELECTIVE SEEDING OF PD BY EXCIMER LASER RADIATION THROUGH THE LIQUID

[75] Inventors: Bodil E. Braren, Hartsdale; Eugene J. M. O'Sullivan, Upper Nyack; Alejandro G. Schrott, New York, all of N.Y.

[73] Assignee: International Business Machines Corporation, Armonk, N.Y.

[21] Appl. No.: 849,273

[22] Filed: Mar. 10, 1992

[51] Int. Cl.⁵ .................. B05D 3/06; B05D 5/12
[52] U.S. Cl. .................. 427/581; 427/597; 427/98
[58] Field of Search ............ 427/581, 597, 555, 98

[56] References Cited

U.S. PATENT DOCUMENTS

| | | | |
|---|---|---|---|
| 4,239,789 | 12/1980 | Blum et al. | 427/555 |
| 4,264,421 | 4/1981 | Bard et al. | 427/581 |
| 4,349,583 | 9/1982 | Kulynych et al. | 427/581 |
| 4,511,595 | 4/1985 | Inoue | 427/581 |
| 4,544,626 | 10/1985 | Sullivan | 430/311 |
| 4,639,378 | 1/1987 | Inoue | 427/555 |
| 4,822,633 | 4/1989 | Inoue | 427/552 |
| 5,059,449 | 10/1991 | Van der Putten et al. | 427/581 |
| 5,063,083 | 11/1991 | Eisch et al. | 427/581 |
| 5,100,693 | 3/1992 | Eisch et al. | 427/581 |
| 5,112,434 | 5/1992 | Goldberg | 427/581 |
| 5,171,608 | 12/1992 | Greene et al. | 427/555 |

FOREIGN PATENT DOCUMENTS

| | | | |
|---|---|---|---|
| 81889 | 6/1983 | European Pat. Off. | 427/581 |
| 2109393 | 5/1987 | Japan | 427/581 |
| 2218580 | 9/1987 | Japan | 427/581 |
| 3192875 | 8/1988 | Japan | 427/581 |
| 64-33543 | 2/1989 | Japan . | |

OTHER PUBLICATIONS

Abstract of Japanes referance 63-083,279 of Toshiba Corp. "Method for Selectively Plating Non Metallic Member" date Apr. 1988.
Abstract of Japanese reference 60-149,782 of Inoue Japan Res. Inc. "Selective Plating Method" date Aug. 1985.

*Primary Examiner*—Marianne Padgett
*Attorney, Agent, or Firm*—Scully, Scott, Murphy and Presser

[57] ABSTRACT

Precise, adherent deposits of a metal such as palladium are formed on an substrate such as polyimide, silicon dioxide, tantalum oxide and polyethylene terephthalate by contacting the substrate surface with a solution of the metal, and then exposing the surface through the solution to laser radiation characterized by a wavelength absorbable by the substrate and a power density and fluence effective to release electrons to promote deposition of the metal onto the substrate without thermal activation of the substrate or the solution.

24 Claims, 1 Drawing Sheet

SELECTIVE SEEDING OF PD BY EXCIMER LASER RADIATION THROUGH THE LIQUID

TECHNICAL FIELD

This application relates to the formation of thin metal films on insulating material such as polyimide. The resultant products are useful in the manufacture of, for instance, microcircuits and chips. The present invention also relates to an improvement in electroless plating of metal onto a metal substrate, through the use of laser light under carefully controlled power and fluence conditions.

DESCRIPTION OF THE PRIOR ART

Previously published attempts to incorporate lasers in processes for plating metal onto substrates have been characterized by a cumbersome series of steps or by the employment of conditions tending to raise the temperature at the substrate surface, thereby introducing the possibility of thermal gradients and distortion at the substrate-metal interface.

For instance, Japanese published application 63-83279 (Abstract) describes producing a plated metal film on a non-metallic substrate from a palladium chloride solution. The thus plated substrate is then dipped in a copper plating solution to form a copper plated film on the substrate. The process forms a predetermined pattern on the substrate, by moving the substrate in a plane which intersects the beam of laser light. The description shows no recognition of the significance of the power and fluence of the laser. The laser light is evidently applied to the substrate in a focused beam, which thus would render the solution subject to pyrolytic (i.e. thermal) decomposition.

Alternatively, according to Japanese published application No. 60-149782 (Abstract), a solution containing palladium chloride is sprayed onto the surface of a substrate while a laser beam irradiates the surface of the substrate. The laser beam heats the substrate and the palladium is deposited by interaction with the heated regions of the substrate.

Similarly, U.S. Pat. No. 4,822,633 employs a high energy beam such as a laser to irradiate a substrate under conditions which heat or thermally activate the surface of the substrate.

U.S. Pat. No. 4,544,626 employs high energy ultraviolet radiation to promote photopolymerization on a surface. The process cannot avoid generating heat but attempts to relieve the effects of the heat by circulating a cooling medium across the heated surface.

Japanese application No. 62-141678 (Abstract) applies a photo sensitive resin to a substrate before exposing the assembly to high energy light beam. The process thus requires additional steps, to apply the resin and to remove the resin following the exposure to the radiation.

In the aforementioned procedures, it is generally accepted or even encouraged that a not insignificant amount of heat is generated within the substrate, and at the substrate surface, upon the exposure of the substrate to the high energy radiation or laser light beam. In those embodiments in which the substrate surface is exposed to a solution, such as a solution containing ions of the metal desired to be deposited upon the substrate surface, the use of the high energy light source will also heat the solution, particularly in the region of the substrate surface. Indeed, in some deposition mechanisms it is strongly desired that the solution be heated at and near the substrate-solution interface, to promote deposition of the metal.

However, the generation of heat poses drawbacks which up to now it has been considered necessary to tolerate. The generation of heat will invariably create thermal gradients, which contribute to an undesirable lack of precision and uniformity in the deposition conditions and, accordingly, in the deposited film. The gradients will, for instance, increase the difficulty of controlling the deposition at any particular point in the desired pattern. In addition, the generation of heat can introduce localized stresses, particularly within the substrate, which also contribute to a lack of precision and uniformity in the formation of the desired pattern on the substrate. The need to cope with such stresses can lead to imperfections even in a film whose tolerances are relatively forgiving. But in applications such as micro electronics, where the deposited film is required to exhibit thicknesses and widths having very precise and minute dimensions, even the slightest variation simply cannot be tolerated.

Thus, there remains a need for a process for depositing thin films of metal upon an inert substrate surface which takes advantage of the benefits of the laser, but does so in a way which permits the operator to avoid the imprecision in finely detailed operation and procedures which result from the employment and/or generation of heat.

SUMMARY OF THE INVENTION

These and other objectives apparent within are realized by the process of the present invention which forms a deposit of metal on an inert substrate, the process comprising the steps of contacting the surface of the substrate with a solution containing ions of the metal to be deposited, providing a source of laser light having a wavelength capable of being absorbed by said substrate, and exposing said surface to said laser light through said solution at a wavelength absorbable by said substrate while simultaneously maintaining a fluence and power density level effective to release electrons to reduce said ions of said metal at said surface without causing thermal activation of the solution or the substrate. In another embodiment of the invention, the surface is exposed to said laser light through said solution under conditions effective to cause the substrate to absorb said light and to emit electrons which reduce said ions to metal, without causing thermal activation of said solution or of said substrate.

DETAILED DESCRIPTION OF THE PREFERRED EMBODIMENT OF THE INVENTION

Figure 1:
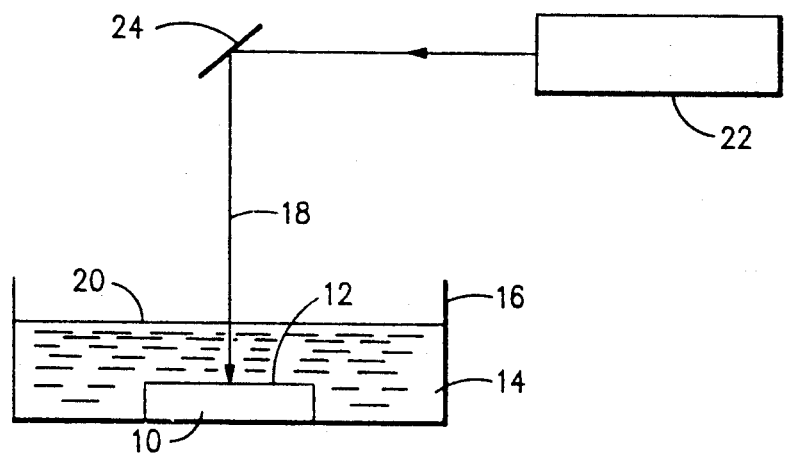
FIG. 1 is a schematic side view illustrating a method in accordance with the present invention.

As indicated, the present invention is useful in forming metal deposits of exacting dimensions on the surfaces of inert substrates, i.e. materials which are not electrically conductive, and with a band gap (intrinsic or due to defect states) less than the energy level of the laser radiation to be applied. Preferred exemplary substrate materials include polymers with strong absorption of ultraviolet laser radiation as described herein, such as polyethylene terephthalate (PET) and polyimide; other examples include silicon dioxide and oxidized tantalum. The preferred substrate is polyimide which will be exemplified in the following description.

The various polyimides that may be employed as the polymer according to the present invention comprise those that are characterized by the presence of the phthalimide structure in the polymer backbone and are conventionally synthesized from dianhydrides and diamines to form poly(amicacid)s which are thermally or chemically cyclized to the polyimide. The precursor polyamic acid or ester is generally soluble whereas the cyclized polyimide is insoluble in solutions customarily employed. Conventional dianhydrides employed in this respect generally comprise pyromellitic dianhydride (PMDA), biphenyl tetracarboxylic dianhydride (BPDA) or benzophenonetetra-carboxylic dianhydride (BTDA) whereas typical diamines comprise meta- or para-dianiline; 4,4'-diamino-diphenyl propane; 4,4'-diamino-diphenylmethane; 4,4'-diaminodiphenylether (oxydiphenylene-diamine, or oxydianiline, or ODA) and the like.

The various polyimides that may be employed according to the invention are disclosed and described further in Edwards U.S. Pat. No. 3,179,614; Lindsey U.S. Pat. No. 3,361,589, Dunphy et al. U.S. Pat. No. 3,770,573 and the various United States Patents cited therein; and Kirk-Othmer, *Encyclopedia of Chemical Technology*, Third Edition, Vol. 18 pp. 704-719 and the various references cited therein all of which are incorporated herein by reference.

Generally, the substrate surface will be flat, although other shapes may also be treated in accordance with this invention. The surface can be smooth or contoured, e.g. etched, in which case the practitioner will make the appropriate adjustments readily within his ability to provide the laser power and fluence described below to the sites at which the desired metal deposition is to occur.

The process of the present invention is useful with any metal capable of forming ions in solution, provided that the ion-metal equilibrium potential of the solution is less than the Fermi level of the substrate material which has been activated by application of the laser as described within. The preferred metals are those which, having been deposited upon the substrate surface, can be used in a subsequent electroless plating step to deposit a second desired metal onto the surface. The second desired metal can be any metal that normally can be electrolessly plated such as copper, cobalt or nickel. The most preferred metal meeting these criteria for deposition pursuant to the process of the present invention is palladium. The palladium is present in solution as a salt, preferably as the chloride, sulfate, acetate, nitrite or nitrate. Other metals meeting these criteria include platinum, gold, iridium and rhodium. The most preferred solutions are aqueous, since they are compatible with the ionic form of the metal and are relatively transparent to the laser radiation.

The concentration of the metal in solution is not critical, but must be high enough to permit effective deposition to occur within a reasonable period of time and not so high that the solubility limits of the metal are approached nor so high that the laser radiation is blocked or absorbed by the solution components. Concentrations on the order of $10^{-4}$ to $10^{-2}$ moles/liter of the metal are satisfactory. The pH of the solution can be from about 0 to 6, and is preferably about 0 to 3. In general, higher pH values within the indicated range are preferred in order to obtain greater deposition of the metal from solution. The upper limit of the pH range is indicated by the limits of solubility of the metal ions and by the need to avoid hydrolysis of the metal ion. The pH can readily be adjusted with, for instance, mineral acid such as sulfuric acid or a strong base such as sodium hydroxide. Other functional ingredients such as a soluble alcohol (i.e. isopropanol, at a solution of 1 to 5%, preferably 4%) can be present in the solution to facilitate the reduction of the metallic species. The process can be carried out at room temperature, i.e. about 25° C.

Referring now to FIG. 1, there is shown a schematic side view illustrating a method in accordance with the present invention. In order to carry out the process of the present invention, a substrate 10 having a surface 12 is immersed in a solution 14 having the characteristics described above. Immersion can be carried out in any number of ways. For instance, the substrate 10 can be placed in a tank or other container 16 holding the solution 14 with the desired surface 12 facing a laser light beam 18. Alternatively, a number of substrates 10 can be placed on a belt (not shown) which conveys the substrates 10 below the surface 20 of solution 14, in order to be exposed to the laser light 18 and which then carries the substrates 10 out of solution 14 following exposure to laser light 18. A laser 22 produces the laser beam 18 which is deflected off of reflector 24 to impinge on the desired surface 12 of substrate 10. The metal in solution 14 will be deposited on substrate 10 only on those areas of surface 12 which are illuminated with laser light 18.

Since it will generally be desired to deposit the metal onto the substrate 10 in a predetermined pattern, it is preferred and convenient to interpose a mask (not shown) between the laser light 18 and the substrate surface 12 which permits laser light to fall only on those regions of the substrate 10 on which it is desired that the metal should be deposited. The materials from which such a mask may be formed, and the techniques for interposing it so as to expose only the desired regions, are well known to those of ordinary skill in this art.

It has been determined that the desired metal can readily be deposited onto the substrate by using laser light having a wavelength that is effective to permit absorption of the laser energy by the substrate and by applying the laser light at a power level per unit of time and a fluence (i.e. power per unit of area of substrate exposed to laser) which are effective to stimulate electrons within the substrate and cause reduction of the metal ions in solution by interaction of the ions with those electrons at the surface of the substrate, all without causing thermal activation of the solution or of the substrate. By "thermal activation" is meant causing the stimulation or emission of electrons within the substrate or the reaction or decomposition of the metal ion within the solution through an increase in the temperature of the substrate or the solution. Preferably, the substrate and solution will experience essentially no change in temperature although minor fluctuations in temperature of a few degrees can be tolerated. Notably, the process of the present invention can be carried out to the desired end of depositing fine, precise films with essentially no change in temperature. This aspect is entirely unforeseen in view of the prior art.

To accomplish this, the energy of the light emitted by the laser is equal to or greater than the band gap energy (intrinsic or due to defect states) of the substrate material in order to generate electron-hole pairs. The electrons that are excited to the conduction band and do not recombine are able to reduce the metal ions at the solid-liquid interface. The metal ions are reduced at the surface of the substrate by electrons which reach the substrate surface and do not recombine thereby raising the Fermi level at the surface of the substrate above the ion/metal equilibrium potential of the solution. The recombination rate can be controlled by adding a reducing agent such as isopropanol at a solution of 1 to 5%, preferably 4%.

As an illustrative example of the above, for the preferred substrate material, polyimide, which has a band gap energy of about 3.5 eV, laser radiation at an energy higher than that level (corresponding to a wavelength of about 308 nanometers or less) is used. Thus, a wavelength of 248 nanometers, or about 5 eV, is effective to produce the desired absorption by the polyimide and resultant generation of excited electrons. The corresponding energy level for other substrates can readily be determined, for instance by exposing a substrate to laser radiation under the conditions described herein at steadily decreasing wavelengths until the desired deposition is observed to occur.

The power level of the laser light in the required wavelength should be high enough to produce a large number of excited electrons within any given unit of time. This is required because of the high probability of recombination for an electron-hole pair. In general, power levels on the order of 100–500 mJ per pulse of about $10^{-8}$ seconds are effective. The duration of exposure to the laser radiation should be effective to promote the deposition without heating the substrate or the solution. Pulsed laser radiation is highly preferred. Pulses up to about $5 \times 10^{-8}$ sec in length are effective.

Surprisingly, energy densities (fluences) of at least about 20 mJ/cm$^2$ at these power levels and wavelengths are effective to produce the desired electron excitation and resultant metal deposition without thermal activation and the concomitant effects thereof. Thus, the corresponding preferred power density is at least about $4 \times 10^5$ watts/cm$^2$ and more preferably at least about $10^6$ watts/cm$^2$. Fluences of this level under these conditions permit the laser beam to be expanded, thereby reducing all the more the risk of thermal activation and the resulting exposure to distortions and gradients.

These correlated conditions of the laser radiation can be maintained using a laser capable of emitting short pulses of radiation whose wavelength is in the ultraviolet region. The preferred source is an excimer laser, which is familiar to those of ordinary skill in this art.

The invention will be described in the following examples.

EXAMPLE

Three different aqueous plating solutions were subjected to the process of the present invention on two different polyimide surfaces. In all runs, the radiation was provided by an excimer laser at 30 mJ/cm$^2$ at 3,600 pulses of $10^{-8}$ seconds each. In run A, the wavelength used was 248 nanometers, and the substrate was pyromellitic dianhydride-oxidianiline (PMDA-ODA). In run B, the wavelength was 308 nanometers on PMDA-ODA. In run C, the wavelength was 308 nanometers and the substrate was biphenyltetracarboxylic dianhydride-phenylene diamine (BPDA-PDA). Solution A contained 0.1 g/l PdSO$_4$ and 1.0M H$_2$SO$_4$, at pH=0. Solution B contained 0.1 g/l PdSO$_4$ and 0.1M H$_2$SO$_4$ at pH=1. Solution C contained 0.2 g/l Pd(CH$_3$CO$_2$)$_2$ and 10% CH$_3$CO$_2$H at pH=2. The relative amounts of palladium coverage for each run with each solution are set forth in Table 1 below (the values are ratios that are proportional to the area occupied by Pd over the total area):

TABLE 1

| Run | Solution A | Solution B | Solution C |
|---|---|---|---|
| A | 0.04 | 0.06 | 0.2 |
| B | 0.05 | 0.09 | 0.1 |
| C | 0.0 | 0.03 | 0.06 |

As can be seen, the amount of palladium deposition increased with increasing pH.

Metal deposits obtained in accordance with the present invention exhibit superior precision in the amounts deposited, superior control of the width and thickness of the deposit, and superior fidelity to the desired pattern when it is desired to form a pattern, by e.g. employing a mask as described above.

Substrates on which metal has been deposited in accordance with this invention can be used for electroless depositing of a second metal, such as copper, onto the substrate by suitable techniques familiar to those of ordinary skill in this art. Such techniques include washing the plated substrate with an aqueous solution containing ions of the desired second metal, or immersing the plated substrate in a solution containing the second metal. The second metal displaces the deposited first metal in accordance with known phenomena. Thus, the second metal must have an ionization potential relative to the deposited first metal which favors the desired displacement. In this way, a precise, uniform and coherent layer of, for instance, copper can be deposited by first forming a deposit of palladium in accordance with the invention described herein, and then immersing the substrate with the palladium film in a solution of a copper salt. Other metals that can be plated in this way include any metal that can be electrolessly plated such as nickel and cobalt.

While the invention has been particularly shown and described with respect to preferred embodiments thereof, it will be understood by those skilled in the art that the foregoing and other changes in form and details may be made therein without departing from the spirit and scope of the invention, which should be limited only by the scope of the appended claims.

Having thus described our invention, what we claim as new, and desire to secure by Letters Patent is:

1. A process for forming a deposit of metal on a substrate selected from the group consisting of polyimide, silicon dioxide, tantalum oxide and polyethylene terephthalate, said substrate having a surface, comprising:
   contacting the surface of said substrate with a solution containing ions of the metal to be deposited,
   providing a source of laser light having a wavelength such that said laser light is capable of being absorbed by said substrate, and
   exposing said surface to said laser light through said solution at a wavelength which renders said laser light absorbable by said substrate while simultaneously maintaining a fluence and a power density effective to release electrons from said substrate to reduce said ions of said metal and thereby deposit said metal onto said surface without causing thermal activation of the solution or the substrate.

2. The process of claim 1 wherein the substrate is polyimide.

3. The process of claim 1 wherein the metal deposited is selected from the group consisting of palladium, platinum, gold, iridium and rhodium.

4. The process of claim 3 wherein said metal is palladium.

5. The process of claim 1 wherein said source of laser light is an excimer laser.

6. A process for depositing a film of metal on a substrate selected from the group consisting of polyimide, silicon dioxide, tantalum oxide and polyethylene terephthalate, comprising depositing a first metal on said substrate in accordance with the process of claim 1 and then exposing said first metal on said substrate to ions of a second metal which is selected from the group consisting of metals which displace said first metal, under conditions effective to permit said second metal to displace said first metal on said substrate.

7. The process of claim 6 wherein said first metal is selected from the group consisting of palladium, platinum, gold, iridium and rhodium.

8. The process of claim 3 wherein said second metal is selected from the group consisting of copper, cobalt and nickel.

9. The process of claim 8 wherein said first metal is palladium.

10. A process for depositing a film of metal selected from the group consisting of palladium, platinum, gold, iridium and rhodium on a substrate selected from the group consisting of polyimide, silicon dioxide, tantalum oxide and polyethylene terephthalate, said substrate having a surface, comprising contacting the surface of said substrate with an aqueous solution containing ions of said metal, providing a laser capable of emitting laser radiation absorbable by said substrate, and exposing said surface to radiation from said laser through said solution at a wavelength which renders said radiation absorbable by said substrate while simultaneously maintaining a fluence and a power level effective to release electrons from said substrate to reduce said ions of said metal at said surface without causing thermal activation of the solution or the substrate.

11. A process according to claim 10 wherein said metal is palladium and said substrate is polyimide, wherein the surface of said substrate is exposed to laser radiation of a wavelength not greater than about 308 nanometers at a fluence level of at least about 20 mJ/cm$^2$ and a power density of at least about $4 \times 10^5$ watts/cm$^2$.

12. A process for depositing a film or metal on a substrate selected from the group consisting of polyimide, silicon dioxide, tantalum oxide and polyethylene terephthalate, comprising depositing a first metal on said substrate in accordance with the process of claim 10 and then exposing said first metal on said substrate to ions of a second metal which is selected from the group consisting of metals which displace said first metal, under conditions effective to permit said second metal to displace said first metal on said substrate.

13. A process for forming a deposit of metal on a substrate selected from the group consisting of polyimide, silicon dioxide, tantalum oxide and polyethylene terephthalate, said substrate having a surface, comprising contacting the surface of said substrate with a solution containing ions of the metal to be deposited, providing a source of laser light having a wavelength such that said laser light is capable of being absorbed by said substrate, and exposing said surface to said laser light through said solution under conditions effective to cause said substrate to absorb said light and to emit electrons from said surface of said substrate without causing thermal activation of said solution or of said substrate wherein said electrons reduce said ions to metal and thereby cause said metal to deposit on said surface.

14. The process of claim 13 wherein the substrate is polyimide.

15. The process of claim 13 wherein the metal to be deposited is selected from the group consisting of palladium, platinum, gold, iridium and rhodium.

16. The process of claim 15 wherein said metal is palladium.

17. The process of claim 13 wherein said source of laser light is an excimer laser.

18. A process for depositing a film of metal on a substrate selected from the group consisting of polyimide, silicon dioxide, tantalum oxide and polyethylene terephthalate, comprising depositing a first metal on said substrate in accordance with the process of claim 13 and then exposing said first metal on said substrate to ions of a second metal which is selected from the group consisting of metals which displace said first metal, under conditions effective to permit said second metal to displace said first metal on said substrate.

19. The process of claim 18 wherein said first metal is selected from the group consisting of palladium, platinum, gold, iridium and rhodium.

20. The process of claim 19 wherein said second metal is selected from the group consisting of copper, cobalt and nickel.

21. The process of claim 20 wherein said first metal is palladium.

22. A process for depositing a film of metal selected from the group consisting of palladium, platinum, gold, iridium and rhodium on a substrate selected from the group consisting of polyimide, silicon dioxide, tantalum oxide and polyethylene terephthalate, the substrate having a surface, comprising contacting the surface of said substrate with an aqueous solution containing ions of said metal, providing a laser capable of emitting laser radiation absorbable by said substrate, and exposing said surface to radiation from said laser through said solution under conditions which cause said substrate to absorb said radiation and to emit electrons from said surface of said substrate without causing thermal activation of said solution or of said substrate wherein said electrons reduce said ions to metal and thereby cause said metal to deposit on said surface.

23. A process according to claim 22 wherein said metal is palladium and said substrate is polyimide, wherein the surface of said substrate is exposed to laser radiation of a wavelength not greater than about 308 nanometers at a fluence level of at least about 20 mJ/cm$^2$ and a power density of at least about $4 \times 10^5$ watts/cm$^2$.

24. A process for depositing a film of metal on a substrate selected from the group consisting of polyimide, silicon dioxide, tantalum oxide and polyethyelene terephthalate, comprising depositing a first metal on said substrate in accordance with the process of claim 22 and then exposing said first metal on said substrate to ions of a second metal which is selected from the group consisting of metals which displace said first metal, under conditions effective to permit said second metal to displace said first metal on said substrate.

* * * * *